(12) United States Patent
Chang et al.

(10) Patent No.: US 9,530,652 B2
(45) Date of Patent: Dec. 27, 2016

(54) METHOD FOR PRODUCING PATTERNED METAL NANOWIRES, ELECTRODE USING THE PATTERNED METAL NANOWIRES, AND TRANSISTOR USING THE PATTERNED METAL NANOWIRE ELECTRODE

(71) Applicant: National Taiwan University, Taipei (TW)

(72) Inventors: Hsuan-Chun Chang, Taipei (TW); Cheng-Yu Chung, Taipei (TW); Wen-Chang Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/695,720

(22) Filed: Apr. 24, 2015

(65) Prior Publication Data

US 2016/0218009 A1    Jul. 28, 2016

(30) Foreign Application Priority Data

Jan. 26, 2015  (TW) .............................. 104102496 A

(51) Int. Cl.
*H01L 23/495*    (2006.01)
*H01L 21/288*    (2006.01)
*H01L 29/417*    (2006.01)
*H01L 29/45*     (2006.01)

(52) U.S. Cl.
CPC ....... *H01L 21/288* (2013.01); *H01L 29/41725* (2013.01); *H01L 29/456* (2013.01)

(58) Field of Classification Search
None
See application file for complete search history.

(56) References Cited

U.S. PATENT DOCUMENTS

| | | | | | |
|---|---|---|---|---|---|
| 4,369,090 | A | * | 1/1983 | Wilson | H01L 21/31133 216/48 |
| 4,709,468 | A | * | 12/1987 | Wilson | H01L 21/4846 257/666 |
| 4,830,706 | A | * | 5/1989 | Horwath | H01L 21/4803 216/17 |
| 2005/0186332 | A1 | * | 8/2005 | Funada | G11B 5/486 427/96.1 |

* cited by examiner

*Primary Examiner* — Earl Taylor
*Assistant Examiner* — Samuel Park
(74) *Attorney, Agent, or Firm* — Muncy, Geissler, Olds & Lowe, P.C.

(57) ABSTRACT

The present invention relates to a method of producing patterned silver nanowire, comprising: coating a photosensitive polyamide acid polymer solution on a silica substrate and dried; using a photomask to paste on the photosensitive polyamic acid and illuminates by ultraviolet; using a developer to obtain a patterned polyamide acid template; coating a metal nanowire suspension on the patterned template; and removing the metal nanowire outside of the patterned polyamic acid. The present invention also discloses an electrode using the patterned metal nanowire and a transistor using the patterned metal nanowire electrode.

8 Claims, 6 Drawing Sheets

METHOD FOR PRODUCING PATTERNED METAL NANOWIRES, ELECTRODE USING THE PATTERNED METAL NANOWIRES, AND TRANSISTOR USING THE PATTERNED METAL NANOWIRE ELECTRODE

BACKGROUND OF THE INVENTION

1. Technical Field

The present relates to a method for producing patterned metal nanowires, electrode using the patterned metal nanowires, and transistor using the patterned metal nanowire electrode.

2. Description of Related Art

With the advancement of technology, the last two decades have seen the emergence of a plethora of computers, communication products, and consumer electronics. In the meantime, it has been an important goal for the designers and manufacturers of many of the display-based electronic products to develop materials featuring both low electrical resistance and high light permeability, and because of that, materials meeting the foregoing criteria such as carbon nanotubes (CNTs), graphene, metal oxides, and metal nanowires are receiving more and more attention. Taking indium tin oxide (ITO)—which has found wide application in transparent conductors—for example, it has outstanding electronic and optical properties and is frequently used in various electronic devices. In particular, ITO plays a crucial role in the development of electronic displays and solar cells. However, the shortage of indium and the high costs of related production equipment have driven scientists to search for alternative materials.

Metal nanowires, especially silver nanowires (AgNWs), are the most promising material for use in transparent conductors in place of ITO. As silver has the highest electrical conductivity of all metals (about 100 times as conductive as ITO), intertwined silver nanowires in a conductor form a highly conductive network, which, due to the high aspect ratio (length/diameter ratio) of silver nanowires, is thinly structured and hence extremely light-permeable (i.e., having a considerable transmission rate) in addition to being highly conductive. Transparent conductors made with silver nanowires have high conductivity and excellent light permeability and are therefore suitable for use as touchscreen sensors or as anodes in an OLED (organic light-emitting diode) lighting system. Besides, transparent conductors made with silver nanowires can serve as pixel electrodes in an electronic display or as the upper and lower electrode plates in a solar cell. Since Microsoft's Windows 8 operating system became commercially available, touchscreens have been incorporated into laptop, desktop, and all-in-one (AIO) computers and become the trend of the market. Most touchscreens are based on a projected capacitance design, which requires high-quality transparent conductors in order to provide satisfactory user experience. Apart from being extensively used in tablet, laptop, and desktop computers and mobile phones, touchscreens are also applied to interactive kiosks, game consoles, POS (point-of-sale) terminals, automobiles, the Global Positioning System (GPS), and many other consumer electronics. Touchscreens, it seems, have turned out to be the most intuitive of all user interfaces. Now that both OLED lighting and organic solar cells demand super high conductivity (e.g., sheet resistance lower than 20 $\Omega/sq$) and exceptional light permeability (e.g., transmission rate higher than 90%), silver nanowires are replacing ITO, which fails to meet those requirements, and have been used by not a few manufacturers in their latest product lines.

In order to respond in real time to ten-point touch control—a feature of the recently developed large touchscreen displays (e.g., 23-inch touchscreens), high conductivity and high-resolution patterning become a must. As metal nanowires are randomly distributed, they do not form visually interfering patterns or Moire patterns and are therefore conducive to better visual effects. Meanwhile, it is generally desired that the touchscreen of a mobile device (e.g., a laptop computer) be lighter, thinner, and more durable, and in response to that, the market demand for plastic films integrated with conductors is exceeding that for the conventional glass substrates. In addition, the successful development of flexible displays has made it necessary to adapt transparent conductors to non-planar designs. That is to say, transparent conductors nowadays must be pliable and rollable as well as patternable. More importantly, given the declining prices of consumer electronics, the costs of transparent conductors must follow suit. Compared with other transparent conductors, those made with silver nanowires can better satisfy the above requirements.

There have been researches on how to pattern metal nanowires (especially silver nanowires) on polymer substrates. Three of the conventional techniques are briefly stated below by way of example.

Prior art technique 1: The "partial etching" process of Cambrios Technologies of US and Toray involves cutting the silver nanowires in the etching area with laser but not removing the cut silver nanowires. Thus, with the cut silver nanowires still present but not in electrical conduction with one another, patterning is achieved.

Prior art technique 2: The Direct Printing Technology (DPT) of Gunze of Japan involves making ink with silver particles whose sizes range from several dozen to several hundred nanometers and forming a silver grid by printing with the ink through a high-precision screen, wherein the silver grid is composed of square openings defined by lines which are 20 μm wide and arranged at an interval of 300~1,000 μm. As the silver grid directly forms the pattern of a touch sensor during the printing process, neither electroplating nor etching is needed, and this technique is applicable to a roll-to-roll process. DPT can make DPT films printed with different sensor patterns, and the films can be used in the form of a single sheet or two sheets stacked together.

Prior art technique 3: Generally, a silver nanowire-containing liquid is applied through a slit to form a roll, which is subsequently patterned by lithography. The entire process, however, is very complicated. Hitachi Chemical of Japan proposed the Transparent Conductive Transfer Film (TCTF) technique, which, published in Finetech Japan, is a new-generation method for making transparent electrode films by a transfer process. The film structure thus produced includes a cover film as the top layer, a 5 μm-thick photoresist film and a transparent conductive layer as the middle layer, and a carrier film as the bottom layer, wherein the transparent conductive layer includes silver nanowires provided by Cambrios. The TCTF method begins by transferring a TCTF to a glass substrate or a transparent plastic substrate at a temperature of 100~140° C. Then, the film is covered with a photomask and exposed to light for the first time. After removing the carrier film, the remaining film structure is exposed to light for the second time, and a developing step (with 1% $Na_2CO_3$ aqueous solution) follows to produce an etched pattern whose depth ranges from 0.4 to 0.8 μm. Last but not least, a high-energy blanket exposure is carried out to cure the insulating layer fully, thereby completing the patterning of the transparent electrode and the bonding of the insulating layer simultaneously.

BRIEF SUMMARY OF THE INVENTION

A brief description has been given above of several existing methods for patterning metal nanowires. In prior art technique 1, silver nanowires are patterned with laser, which nevertheless tends to cause direct damage to the substrate. Moreover, the pattern generated by the laser-cut silver nanowires is visible to the naked eye, and even worse, the resultant silver nanowire film is disadvantaged by diffuse reflection and haze problems. A hazed screen may generate strong reflection when exposed to outdoor light, and the reflection can be so strong that the user cannot clearly see what is displayed on the screen. In view of the above, prior art technique 1 is not well accepted in the market.

As to prior art technique 2, the silver particle-containing ink is indeed suitable for roll-to-roll mass production, but due to the marked difference in conductivity and light permeability between silver particles and silver nanowires, this technique cannot be used on large touchscreens or like electronic devices which demand very high conductivity.

In prior art technique 3, the photoresist film is 5 μm thick, and the portion of the photoresist film that remains after the lithographic step may result in high contact resistance in a transistor and thus reduce electron mobility.

To solve the issues stated above, it is an object of the present invention to provide a method for producing patterned metal nanowires, comprising the steps of: (a) applying a solution of a photosensitive polyamic acid polymer to a silicon substrate, and drying the solution by baking; (b) attaching a photomask to the photosensitive polyamic acid polymer, and irradiating the photosensitive polyamic acid polymer with energy rays; (c) developing the photosensitive polyamic acid polymer with a developer solution to obtain a patterned template having a patterned polyamic acid; (d) coating the patterned template with a metal nanowire suspension; and (e) removing metal nanowires outside the patterned polyamic acid.

Preferably, the solution of the photosensitive polyamic acid polymer is applied at a thickness of 450-2000 nm.

Preferably, the silicon substrate is a silicon dioxide wafer.

Preferably, the solution of the photosensitive polyamic acid polymer is obtained by first preparing a polyamic acid polymer solution from 1,4-cyclohexyldiamine (CHDA) monomers and 3,3',4,4'-biphenyltetracarboxylic acid dianhydride (BPDA) and then adding a cinnamic-type photobase generator (PBG) into the polyamic acid polymer solution.

Preferably, the solution of the photosensitive polyamic acid polymer has a viscosity of 0.3~0.4 dL/g.

Preferably, the step (d), the patterned template is coated with the metal nanowire suspension by spray coating.

Preferably, the metal nanowire suspension is prepared from an ethanol solution and contains said metal nanowires at a concentration of 1 mg/ml.

Preferably, the step (e), the metal nanowires outside the patterned polyamic acid are removed by peeling with an adhesive tape.

Another embodiment of the present invention is to provide an electrode using the patterned metal nanowires produced by the method above, comprising: the silicon substrate; the patterned template formed on the silicon substrate and having the patterned polyamic acid; and said metal nanowires attached to the patterned polyamic acid.

Another embodiment of the present invention is to provide a transistor using the electrode of above.

In contrast to the prior art techniques, the present invention applies a photosensitive polyamic acid polymer solution to a silicon substrate, and by means of heating, the polyamic acid is imidized and hence turned into a polyimide film, wherein the higher the temperature to which the polyamic acid is heated, the higher the degree of imidization. The degree of imidization can be determined according to the characteristic absorption bands of imide at 1765 $cm^{-1}$ (asymmetrical C=O), 1693 $cm^{-1}$ (symmetrical C=O), and 736 $cm^{-1}$ (imide ring deformation) and by the disappearance of the absorbance value of polyamic acid at 3000 $cm^{-1}$ (broadband O—H). Whether polyamic acid has completely transformed into polyimide can be determined by changes in the aforesaid peak values. In the present invention, polyimide is formed by partial imidization of polyamic acid, meaning polyamic acid remains in certain portions of the resultant polyimide. The amino group and carboxylic group of the remaining polyamic acid form coordinate bond with lone-pair electrons of the metal nanowires such that the metal nanowires are firmly attached to the polyamic acid. In the subsequent peeling step, therefore, only metal nanowires outside the polyamic acid pattern will be peeled off, and patterned metal nanowires are thus obtained. The patterned metal nanowires obtained from the foregoing process can be further heated to 250° C. to effect complete imidization of the polyamic acid, thereby turning all the polyamic acid into polyimide, with a view to reducing water absorbance—a property inherent to polyamic acid.

Polyimide formed by partial or complete imidization of polyamic acid is a polymer with repeated highly polar, pentagonal imide units and has such advantageous features as excellent thermal stability, resistance to chemical corrosion, and high mechanical strength. In addition, polyimide substrates are lightweight, thin, and flexible, have a flat surface, exhibit good chemical resistance, and do not have metal spreading issues when under high temperature. Hence, of all high-performance polymers, polyimide is the most suitable for making pliable substrates. Although a polyimide polymer remains, too, after the lithographic step in the present invention, the thickness of the remaining polyimide polymer can be reduced to the nanometer scale by adjusting the concentration of polyimide. Thus, the adverse effects of the resultant contact resistance are substantially ameliorated while light permeability stays high.

BRIEF DESCRIPTION OF THE SEVERAL VIEWS OF THE DRAWINGS

FIG. 6(A) shows an electron transport characteristic curve while

DETAILED DESCRIPTION OF THE INVENTION

Figure 1:
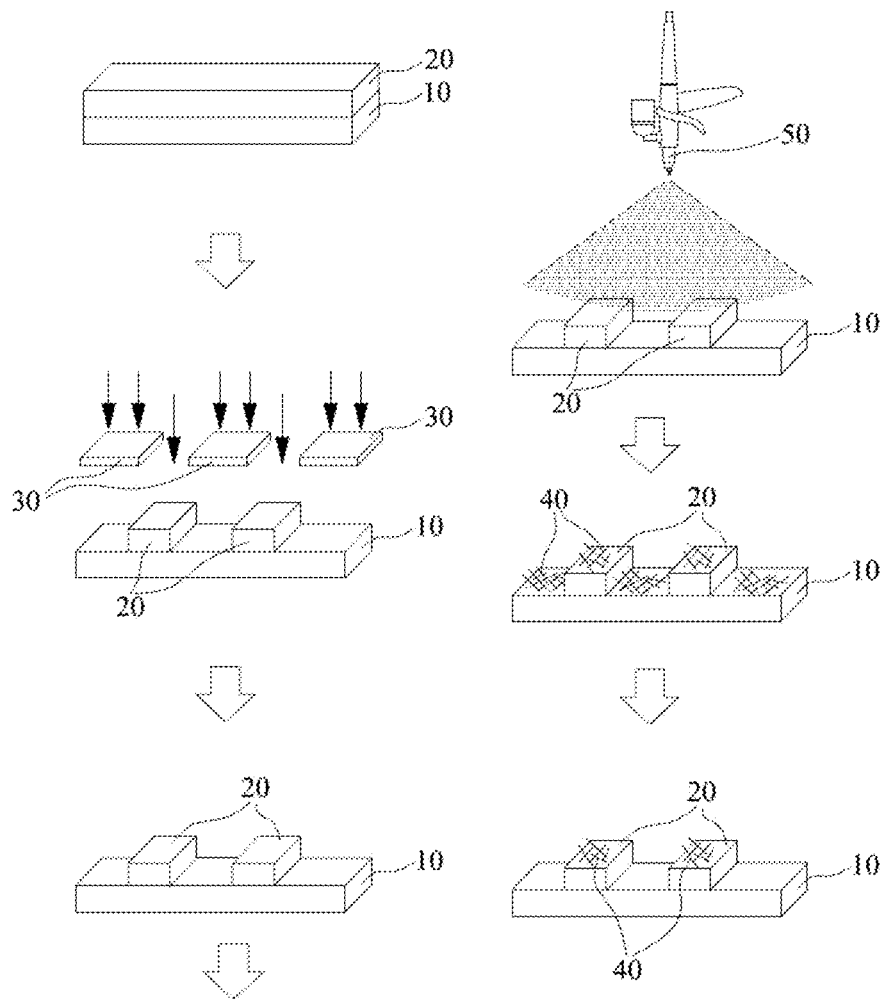
FIG. 1 schematically shows the process flow of how patterned silver nanowire electrodes are formed according to the present invention.

The indefinite article "a", when used in conjunction with "comprise" or "comprising" in the appended claims or in the present specification, may refer to "one" but also connotes "one or more" or "at least one".

[The Method for Producing Patterned Metal Nanowires of the Present Invention]

It is an object of the present invention to provide a method for producing patterned metal nanowires, comprising the steps of: (a) applying a solution of a photosensitive polyamic acid polymer to a silicon substrate, and drying the solution by baking; (b) attaching a photomask to the photosensitive polyamic acid polymer, and irradiating the photosensitive polyamic acid polymer with energy rays; (c) developing the photosensitive polyamic acid polymer with a developer solution to obtain a patterned template having a patterned polyamic acid; (d) coating the patterned template with a metal nanowire suspension; and (e) removing metal nanowires outside the patterned polyamic acid.

In the present invention, a photosensitive polyamic acid polymer solution is imidized by heating in order to form a polyimide film, and the degree of imidization of the polyimide film is determined by Fourier transform infrared spectroscopy (FTIR). Herein, unless it is specifically stated that the photosensitive polyimide film is formed by complete imidization of polyamic acid, the film is formed by partial imidization, meaning polyamic acid remains in certain portions of the film. Therefore, the photosensitive polyimide film referred to herein as partially retaining the amino group and carboxylic group of polyamic acid is equivalent in meaning to the "patterned polyamic acid". There are no special limitations on the photosensitive polyamic acid polymer used in the present invention; the polymer can be prepared from a conventional dianhydride and a conventional diamine. Preferably, the photosensitive polyamic acid polymer is a negative-type photosensitive polyamic acid.

In the present invention, the photosensitive polyamic acid polymer solution is obtained by adding a photoinitiator into a polyamic acid polymer solution. The photoinitiator generates free radicals when exposed to light, and the transfer of free radicals induces polymerization. There are no special limitations on the photoinitiator used in the present invention. Suitable photoinitiators include but are not limited to benzophenone; benzoin; 2-hydroxy-2-methyl-1-phenyl-propan-1-one; 2,2-dimethoxy-1,2-diphenylethan-1-one; 1-hydroxy cyclohexyl phenyl ketone; 2,4,6-trimethylbenzoyl diphenyl phosphine oxide; or a mixture thereof. The preferred photoinitiator is a cinnamic-type photobase generator (PBG).

In another preferred embodiment of the present invention, the photosensitive polyamic acid polymer solution is obtained by adding a cinnamic-type PBG into a polyamic acid polymer solution prepared from 1,4-cyclohexyldiamine (CHDA) monomers and 3,3',4,4'-biphenyltetracarboxylic acid dianhydride (BPDA), wherein CHDA is white crystals obtained by recrystallization and purification of hexane and oven-drying the intermediate product at room temperature for 24 hours.

The type and amount of the photoinitiator added depend on the type of the polyamic acid in use. Generally, in terms of weight, about 0.01 to about 25 portions of photoinitiator is added into 100 portions of polyamic acid. If too little photoinitiator is added, there will be a shortage of supply of free radicals upon exposure, and photosensitivity will be reduced as a result. Conversely, if the photoinitiator is added excessively, the film surface will absorb too much light upon exposure and thus prevent light from reaching the inside of the film, causing a difference in polymerization speed between the interior and the surface of the film. In the aforesaid preferred embodiment, the mixing ratio between the polyamic acid polymer solution and the cinnamic-type PBG is preferably but is not limited to 4:1, and the mixture is preferably stirred with magnets overnight.

The photosensitive polyamic acid polymer solution can be added with a small amount of additives such as a silane coupling agent in order for the photosensitive polyimide resin to bond more securely to the substrate. Commonly used silane coupling agents include but are not limited to (3-aminopropyl)trimethoxysilane, (3-aminopropyl)triethoxysilane, (2-aminopropyl)trimethoxysilane, (2-aminopropyl)triethoxysilane, and mixtures thereof.

In the present invention, the photosensitive polyamic acid polymer solution is applied at a nanometer-scale thickness to form a template, wherein the thickness ranges from 450 to 2000 nm and is preferably 860 nm.

The photosensitive polyamic acid polymer solution can be applied to the silicon substrate by a conventional application technique such as spin coating. In another preferred embodiment, the silicon substrate is a silicon dioxide wafer.

In the foregoing step (a), the baking conditions can be so set that the pre-exposure bake is performed at 90° C. to 110° C. for 5 to 15 minutes and preferably at 100° C. for 10 minutes.

The rays of energy used in the foregoing step (b) refer to light of a certain range of wavelength, such as but not limited to ultraviolet (UV) light, infrared light, visible light, or rays of heat (radiation). The rays of energy are preferably ultraviolet light. In a preferred embodiment, the foregoing step (b) includes irradiating the substrate with UV light, then placing the substrate on a heating tray, and baking the substrate at 190° C. for 4 to 5 minutes, preferably 4.5 minutes, so that the irradiated portions of the polyamic acid polymer are imidized.

There are no special limitations on the developer solution used in the foregoing step (c), and the development process can be carried out by immersion, spraying, or other well-known methods in order to obtain the desired pattern. The developer solution can be an alkaline aqueous solution of sodium hydroxide, of potassium hydroxide, of sodium carbonate, of potassium carbonate, or of tetramethylammonium hydroxide (TMAH). The preferred alkaline aqueous developer solutions include but are not limited to an aqueous solution containing 2.38 wt % of TMAH, an aqueous solution containing 1-5 wt % of sodium carbonate, and a mixture thereof.

In the foregoing step (c), the development process is carried out preferably but not necessarily with an alkaline developer solution, and the development time is 2 to 3 minutes. After development, the substrate can be washed by immersion, spraying, or other well-known methods. The washing liquid can be water or be prepared by adding an organic solvent into water. Preferably, the washing liquid is kept at an appropriate temperature so as to remove the residues left on the substrate after development. From the perspective of residue removal, the temperature of the washing liquid is preferably 15° C.~60° C. and more preferably 20° C.~50° C. After washing with the washing liquid, an aqueous solution of an inorganic or organic acid can be used for further washing. Suitable inorganic acid aqueous solutions include, for example, an aqueous solution of hydrochloric acid, of sulfuric acid, of phosphoric acid, or of boric acid. Suitable organic acid aqueous solutions include, for example, an aqueous solution of methanoic acid, of ethanoic acid, of citric acid, or of lactic acid. From the viewpoint of washing efficiency, the duration of washing with an inorganic or organic acid aqueous solution is preferably 5 to 120 seconds and more preferably 10 to 60 seconds. When an acidic aqueous solution is used for washing, it is preferable that the acidic aqueous solution is subsequently washed away with water.

Herein, "metal nanowires" refer to any metal nanowires that are electrically conductive, such as those made of gold, silver, or copper. The metal nanowires are preferably silver nanowires. The preparation method of the metal nanowire suspension is well-known in the art and therefore is not described herein. In another preferred embodiment, the patterned template in the foregoing step (d) is coated with the metal nanowire suspension by spray coating. There are no limitations on the length and diameter of the metal nanowires. Preferably, the metal nanowires have an average length of 30 μm, an average diameter of 90 nm, and an average aspect ratio (=length/diameter) greater than 300. The higher the length/diameter ratio, the higher the transparency and electrical conductivity.

In another preferred embodiment, the metal nanowire suspension is prepared from an ethanol solution, and the concentration of metal nanowires in the suspension is 1 mg/ml.

In the foregoing step (e), there are no special limitations on how the metal nanowires outside the patterned polyamic acid should be removed. In a preferred embodiment, the foregoing step (e) includes peeling with an adhesive tape in order to remove the metal nanowires outside the patterned polyamic acid.

Using the method mentioned above, another embodiment of the present invention is to provide an electrode using the patterned metal nanowires produced by the method above, comprising: the silicon substrate; the patterned template formed on the silicon substrate and having the patterned polyamic acid; and said metal nanowires attached to the patterned polyamic acid.

By using the electrode using the patterned metal nanowires of the present invention, another embodiment of the present invention is to provide a transistor using the electrode of above.

Illustrative Embodiments

Embodiments may be used in the specification for the convenience for a reader, which shall have no influence on the scope of the present invention.

Preparation Example

Synthesis of polyimide Film, or More Particularly Poly(t-1,4-Cyclohexyldiamine-Biphenylimide) (CHBPDAPI) Film Trans-1,4-cyclohexanediamine (CHDA) (0.1142 g, 1.0 mmol) was dissolved in 2.2 ml of dimethylacetamide (DMAc) in a nitrogen atmosphere at 70° C. The solution was let cool to room temperature and then slowly added with ethanoic acid (0.1321 g, 2.2 mmol). About 10 minutes later, 4,4'-biphthalic anhydride (0.3528 g, 1.2 mmol) was added into the solution. The reaction solution was stirred with magnets at room temperature for six hours such that a polyamic acid (PAA) polymer solution was obtained. It was found that the polyamic acid solution became transparent and viscous, with an intrinsic viscosity of about 0.3~0.4 dL/g. After that, the polyamic acid polymer solution was mixed with a PBG in a ratio of 4:1 by weight to produce a photosensitive polyamic acid polymer solution, which was then stirred with magnets overnight.

Embodiment 1

Forming a Photosensitive Polyimide (CHBPDAPI) Pattern by Lithography, and Patterned Silver Nanowire Electrodes, by Spraying Silver Nanowires with a Spray Gun A detailed description is given below with reference to FIG. 1.

Figure 2A:
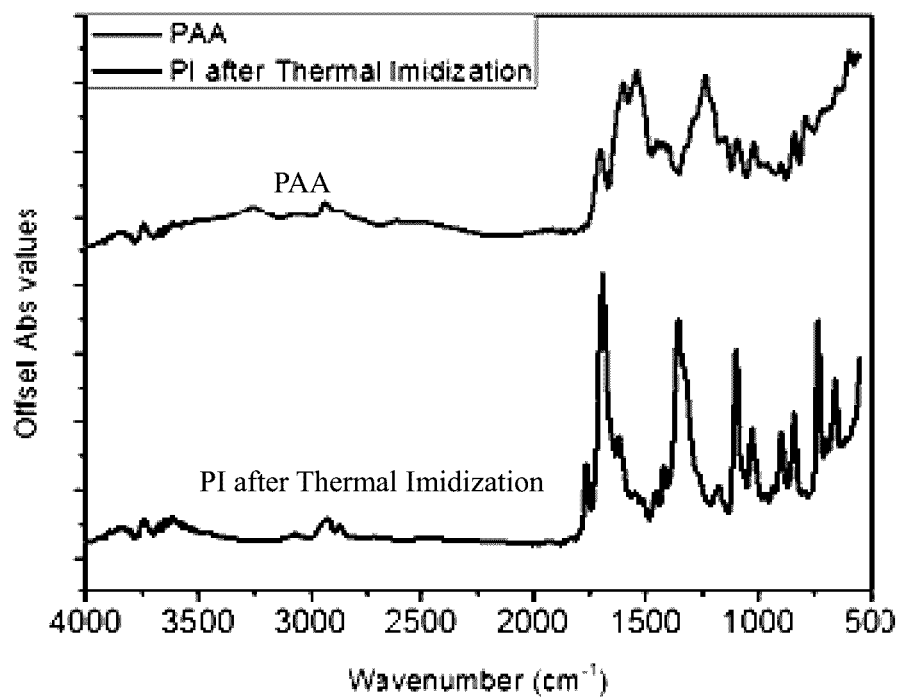
FIG. 2(A) is an infrared (IR) spectrum of CHBPDAPI and CHBPDAPAA.

The photosensitive polyamic acid polymer solution obtained from the preparation example was spin-coated onto a silicon substrate 10 (silicon wafer) on which silicon dioxide had grown. The coated substrate was subjected to a pre-exposure bake at 100° C. in an air atmosphere for ten minutes. Once the solution was dried by baking, a partially imidized photosensitive polyimide film 20 (meaning polyamic acid was left in certain portions of the film 20) was formed. More specifically, certain portions of the photosensitive polyimide film 20 retained the amino group and carboxylic group of polyamic acid. The degree of imidization of the photosensitive polyimide film 20 was determined by FTIR: as stated above, the photosensitive polyamic acid polymer solution (herein abbreviated as CHBPDAPAA) was partially imidized by heating (i.e., the pre-exposure bake) and thus turned into the photosensitive polyimide (CHBPDAPI) film 20, and it is known that the higher the heating temperature, the higher the degree of imidization. The FTIR spectrums of the photosensitive polyamic acid and of the photosensitive polyimide film 20 are plotted in FIG. 2(A).

The degree of imidization was determined according to the characteristic absorption bands of imide at 1765 cm$^{-1}$ (asymmetrical C=O), 1693 cm$^{-1}$ (symmetrical C=O), 736 cm$^{-1}$ (imide ring deformation) and by the disappearance of the absorption value of polyamic acid at 3000 cm$^{-1}$ (broadband O—H). Whether polyamic acid has completely transformed into polyimide was determined by changes in the aforesaid peak values.

After the photosensitive polyamic acid polymer solution was dried by baking and thus formed the partially imidized photosensitive polyimide film 20, a photomask 30 with a pre-designed pattern (which, in this embodiment, consisted of plural pairs of vertical line segments, a 40-μm spacing (by which resolution was defined) between each pair of the vertical line segments, a 7-mm horizontal line segment extending outward from each vertical line segment, and a 1×1 mm square at the distal end of each horizontal line segment) was attached by a vacuum lamination technique to the silicon dioxide substrate 10 coated with the photosensitive polyimide film 20. The silicon dioxide substrate 10 was then irradiated with UV light provided by a broadband super-high-voltage mercury lamp. After the UV irradiation, the silicon dioxide substrate 10 was placed on a heating tray and subjected to post-exposure bake at 190° C. for 4.5 minutes. Following that, a development process was performed with an alkaline developer solution (an aqueous solution prepared by mixing 2.38 wt % TMAH(aq) with 20 wt % iPrOH) at 25° C. for 2~3 minutes such that the pre-designed pattern of the photomask 30 was revealed.

Next, a silver nanowire suspension prepared by suspending silver nanowires 40 in an ethanol solution was diluted to a concentration of 1 mg/ml and sprayed onto the developed photosensitive polyimide film 20/silicon dioxide substrate 10 with a spray gun 50, whose nozzle was 9 cm away from the silicon dioxide substrate 10 and which used a flow rate of 0.033 ml/s. The spray coating process lasted 60 seconds. Then, the silicon dioxide substrate 10 was heated to 200° C. for 30 minutes in order to spread the silver nanowires over the polyamic film 20/silicon dioxide substrate 10. After that, a piece of 3M adhesive tape was used for peeling. More specifically, the adhesive tape was repeatedly applied to and peeled off the entire substrate surface until all the silver nanowires outside the patterned photosensitive polyimide film 20 were removed. Such removal was made possible by the fact that certain portions of the partially imidized photosensitive polyimide film 20 retained the amino group and carboxylic group of polyamic acid, and that therefore the bond between the silver nanowires 40 and the silicon dioxide substrate 10 was different from that between the silver nanowires 40 and the partially imidized photosensitive polyimide film 20. Consequently, only those silver nanowires 40 on the patterned photosensitive polyimide film 20 remained, and patterned silver nanowire electrodes were thus obtained.

Figure 2B:
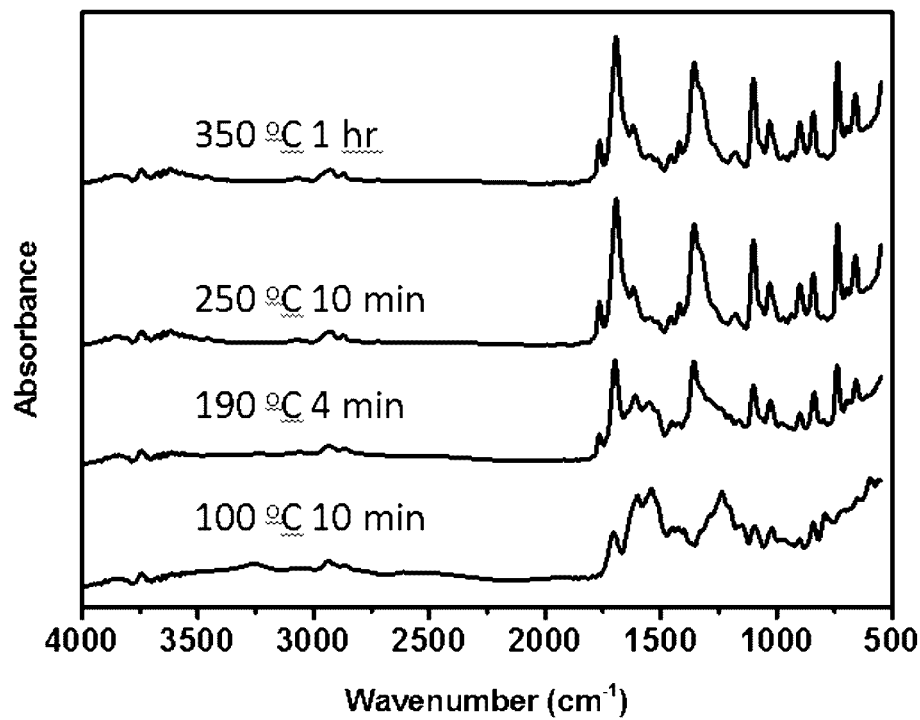
FIG. 2(B) is an IR spectrum of CHBPDAPAA as a result of stepwise heating after mixing with PBG.

In this embodiment, the introduction of PBG effectively enabled photo-patterning of polyamic acid. Further, the base generated by the PBG after UV irradiation served effectively as a catalyst for polyamic acid, allowing the polyamic acid to transform completely into polyimide at a relatively low temperature (<250° C.), as shown in FIG. 2(B). It can be known from the above that, after 4~5 minutes of post-exposure baking at 190° C., polyamic acid was partially imidized and turned into the photosensitive polyimide film 20, in which the remaining amino group and carboxylic group of polyamic acid formed coordinate bond with lone-pair electrons of the silver nanowires 40. As a result, a relatively strong attachment existed between the silver nanowires 40 and the photosensitive polyimide film 20, preventing the silver nanowires 40 on the film from being peeled off by the 3M adhesive tape, and this explains why only those silver nanowires 40 outside the photosensitive polyimide film 20 pattern were peeled off when the 3M adhesive tape was repeatedly applied to and peeled from the entire coated surface of the patterned photosensitive polyimide film 20/silicon dioxide substrate 10.

Results

The results are detailed below with reference to FIG. 3.

Figure 3A:
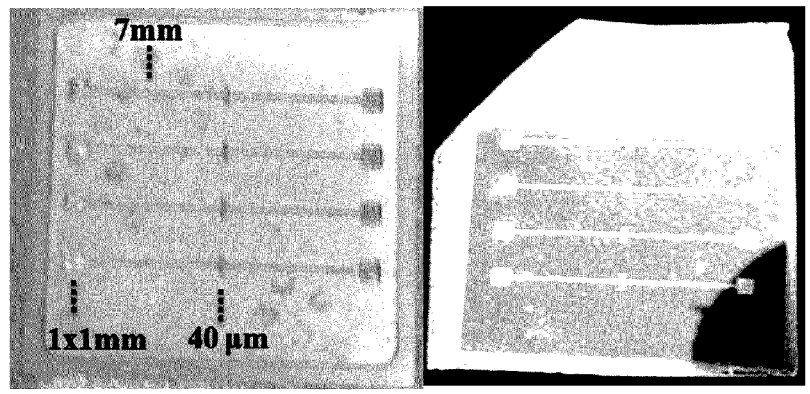
FIG. 3(A) is a macroscopic view of the CHBPDAPAA/silicon dioxide substrate, showing in particular the negatively developed pattern, with the left panel showing the design of the photomask, and the right panel, the patterned polyamic acid obtained after the lithographic step.
Figure 3B:
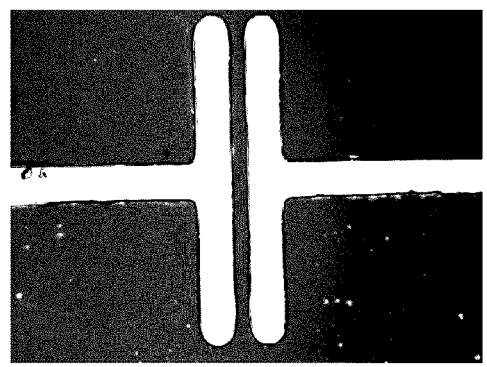
FIG. 3(B) is an optical microscope image of the negatively developed pattern of the CHBPDAPAA, the patterned polyamide obtained from the lithographic step, wherein the CHBPDAPAA/PBG (80/20 wt/wt) system results in a 0.8 nm-thick PAA film, the pre-exposure baking conditions being 100° C., 5 minutes; the broadband exposure condition being 500 mJ/cm$^2$; and the post-exposure baking (PEB) conditions being 190° C., 4 minutes; the left panel of FIG. 3(C) shows the surface contour of the partially imidized CHBPDAPI film, or more particularly of the two electrodes at the center of the photomask, after the film is subjected to a post-exposure bake at 190° C. for 4.5 minutes in a nitrogen atmosphere, the resolution being 50 μm; and the right panel of FIG. 3(C) shows the surface contour of the partially imidized CHBPDAPI film, or more particularly of one of the left and right 100×100 μm squares, after the film is subjected to the post-exposure bake at 190° C. for 4.5 minutes in a nitrogen atmosphere.
Figure 3C:
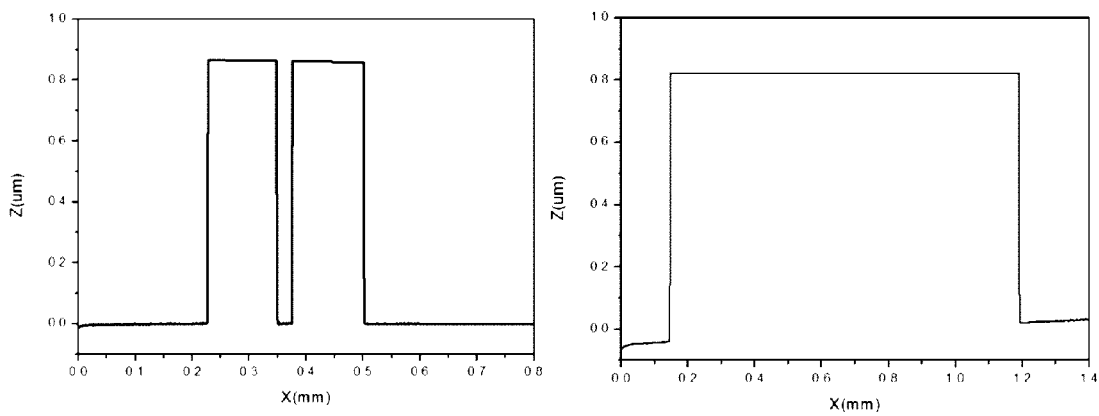

Macroscopically, the development result shown in FIG. 3(A) demonstrates that the photosensitive polyimide film 20 successfully transferred the pattern of the photomask. Microscopically, the optical microscope image in FIG. 3(B) shows a detail in the pattern of the negative-type photosensitive polyimide film 20. According to FIG. 3(B), the developed pattern on the photosensitive polyimide film 20 conformed to the designed template defined by the photomask 30. Also, the parallel channels in the negative pattern on the photosensitive polyimide film 20 were free of residues of the photosensitive polyimide film 20 (the parallel channels were subsequently spray coated to form two electrodes of a transistor) and defined a resolution of 40 μm. Moreover, no damage was found in the pattern in this optical microscope image. The thickness of the pattern and the flatness of the pattern material were measured with MICROFIGURE MEASURING INSTRUMENT-Surfcorder ET3000, and the results are plotted in FIG. 3(C), according to which the material was very flat and had a thickness of 0.8 μm after development. The optical microscope image and the MICROFIGURE MEASURING INSTRUMENT-Surfcorder ET3000 measurement results show that the technique of the present invention produced satisfactory results: not only were the channels free of residues of the photosensitive polyimide film 20, but also the pattern material was perfectly flat. These advantageous features ensure that the silver nanowires 40 have good electrical conductivity once they are applied by spray coating, and that the resultant electrodes are kept from electrical conduction with each other.

Figure 4A:
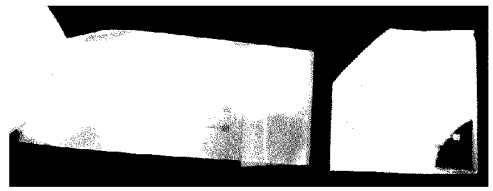
FIG. 4(A) shows how a piece of 3M adhesive tape (left) is used to peel silver nanowires off the entire silver nanowire-coated surface of the AgNWs/CHBPDAPAA/silicon dioxide substrate (right)

Further discussion is provided below with reference to FIG. 4.

Figure 4B:
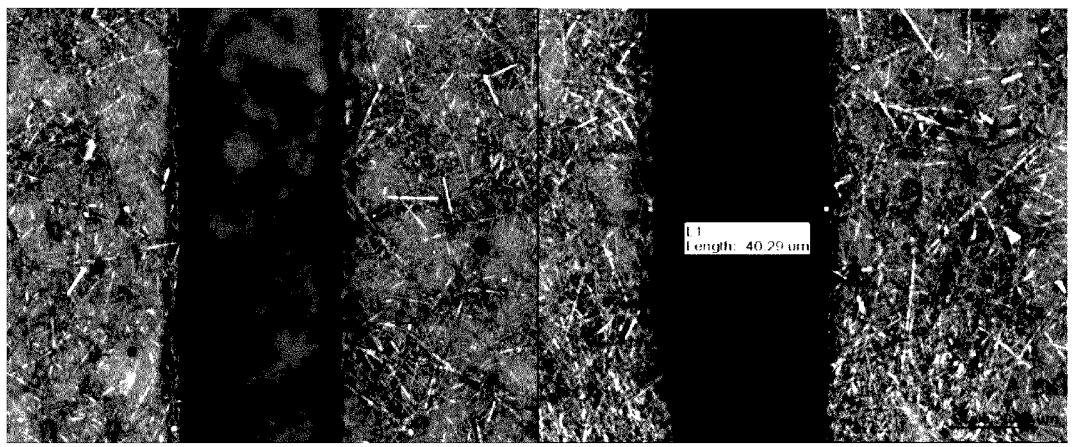
FIG. 4(B) presents optical microscope images of the silver nanowire-coated, negatively developed pattern of CHBPDAPAA/PBG (80/20 wt/wt), focusing on the CHBPDAPAA, with the left panel showing the condition before peeling with the 3M adhesive tape, and the right panel, after peeling with the 3M adhesive tape.
Figure 4C:
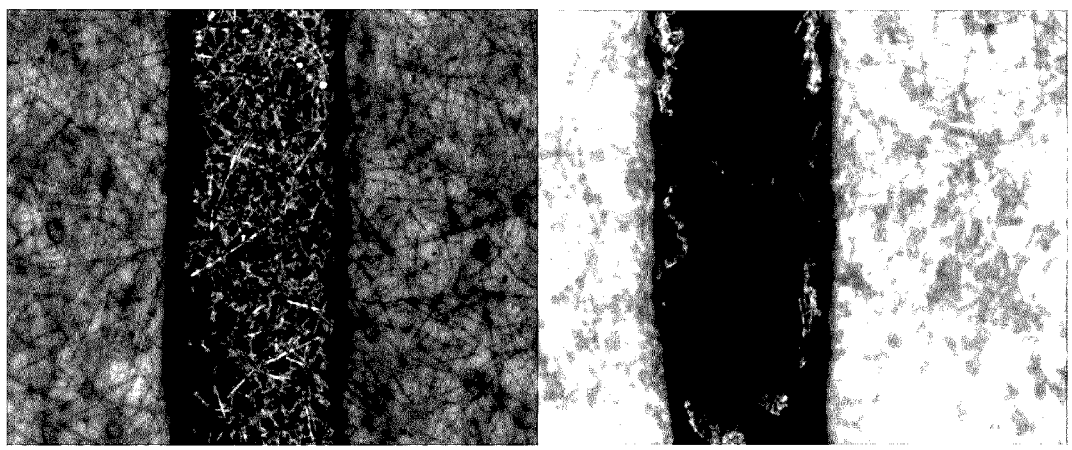
FIG. 4(C) presents optical microscope images of the silver nanowire-coated, negatively developed pattern of CHBPDAPAA/PBG (80/20 wt/wt), focusing on the silicon dioxide substrate instead, with the left panel showing the condition before peeling with the 3M adhesive tape, and the right panel, after peeling with the 3M adhesive tape.

By spraying the silver nanowires 40 with the spray gun 50, a uniform distribution of the silver nanowires 40 can be achieved with a relatively small amount of silver nanowires 40. The flatness of the photosensitive polyimide film 20 also allows the silver nanowires 40 to be distributed evenly and densely on the photosensitive polyimide film 20. As mentioned above, the amino group and carboxylic group of the non-imidized polyamic acid remaining in the photosensitive polyimide film 20 formed coordinate bond with lone-pair electrons of the silver nanowires 40 such that the silver nanowires 40 were firmly attached to the photosensitive polyimide film 20 and kept from being peeled off by 3M adhesive tape. Such a strong attachment, however, did not exist between the silicon dioxide substrate 10 and the silver nanowires 40. Therefore, after the silver nanowires 40 were sprayed with the spray gun 50 and spread by being heated to 200° C., only those silver nanowires 40 attached to the substrate in areas outside the patterned photosensitive polyimide film 20 were peeled off during the peeling process, in which 3M adhesive tape was repeatedly applied to and peeled off the entire silver nanowire 40-coated surface of the patterned photosensitive polyimide film 20/silicon dioxide substrate 10. Macroscopically, referring to FIG. 4(A), the silver nanowires 40 were left attached only to the patterned photosensitive polyimide film 20; all the silver nanowires 40 which were once in the areas outside the patterned photosensitive polyimide film 20 have been peeled off by the 3M adhesive tape. Microscopically, FIG. 4(B) presents comparative optical microscope images which were taken after the silver nanowires 40 were sprayed and the 3M adhesive tape, applied and peeled off repeatedly; and which were focused on the photosensitive polyimide film 20/silicon dioxide substrate 10 or more specifically on the photosensitive polyimide film 20. The images in FIG. 4(B) show that the silver nanowires 40 on the photosensitive polyimide film 20/silicon dioxide substrate 10 remained in high density after the 3M adhesive tape was peeled off more than three times. FIG. 4(C) presents more comparative optical microscope images taken after the silver nanowires 40 were sprayed and the 3M adhesive tape, applied and peeled off repeatedly. The images in FIG. 4(C) were focused on the silicon dioxide substrate 10 instead, showing clearly that silver nanowires 40 which once occupied the space between the two electrodes have been completely removed to prevent electrical conduction between the two electrodes.

Besides, prior to the 3M adhesive tape peeling step, the electrical conductivity of the silver nanowires 40 was measured with a four-point probe as $2.2\sim2.5\times10^4$ $\Omega^{-1}$ $cm^{-1}$. After the 3M adhesive tape was applied and peeled off several times, the conductivity of the two electrodes was measured as $1.3\sim1.4\times10^4$ $\Omega^{-1}$ $cm^{-1}$. It can therefore be concluded that the silver nanowires 40 remained highly conductive. According to the optical microscope images and the four-point probe measurement results, the silver nanowires 40 attached firmly to polyamic acid only, which allows the silver nanowires 40 to be successfully patterned and retain high conductivity in order to serve as silver nanowire electrodes.

Embodiment 2

Figure 5:
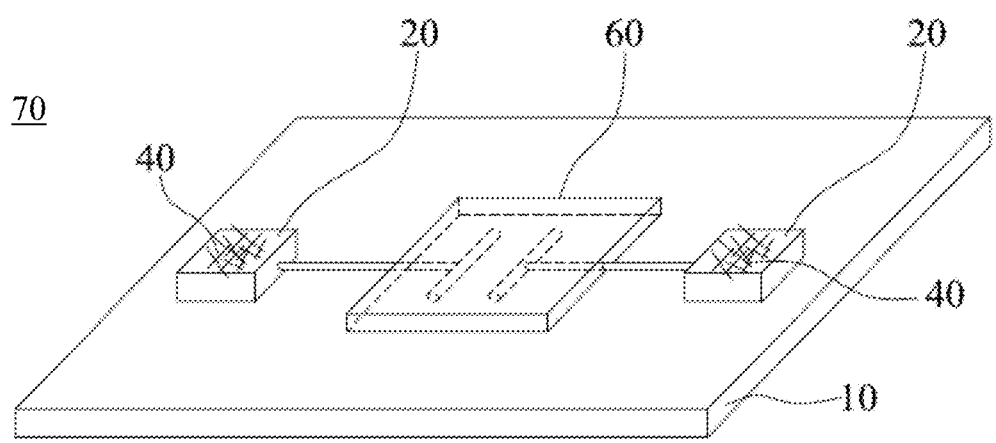
FIG. 5 schematically shows how a field-effect transistor is made according to the present invention.

Making Field-Effect Transistor 70 by Vacuum-Sputtering Pentacene 60 on Silver Nanowire Electrodes A detailed description is given below with reference to FIG. 5.

The silver nanowire electrodes formed in Embodiment 1 were used. It was confirmed that each of the left and right electrodes was electrically conductive but not in electrical conduction with the other. A pre-designed photomask (which was a 1×1 mm square) was tightly attached to the patterned silver nanowire electrodes to cover, in particular, the two independent electrodes at the center. Following that, pentacene 60 was vacuum-sputtered on the two independent electrodes at a thickness of 50 nm, and a field-effect transistor 70 was thus formed, as shown in FIG. 5. The electrical performance of the transistor was subsequently tested.

Test Results of the Electrical Performance of the Field-Effect Transistor

Figure 6A:
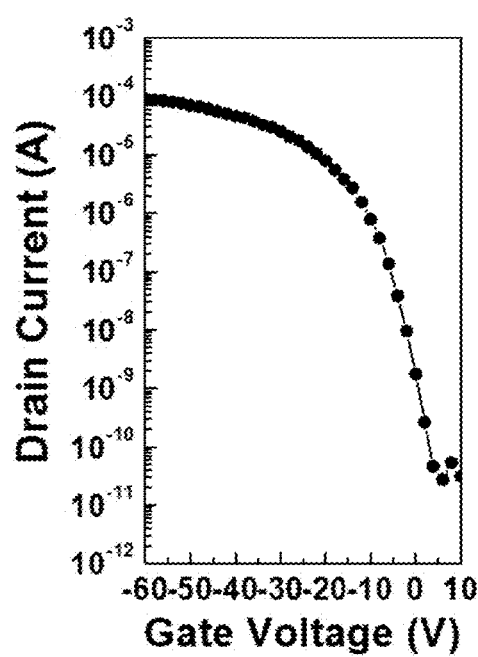
Figure 6B:
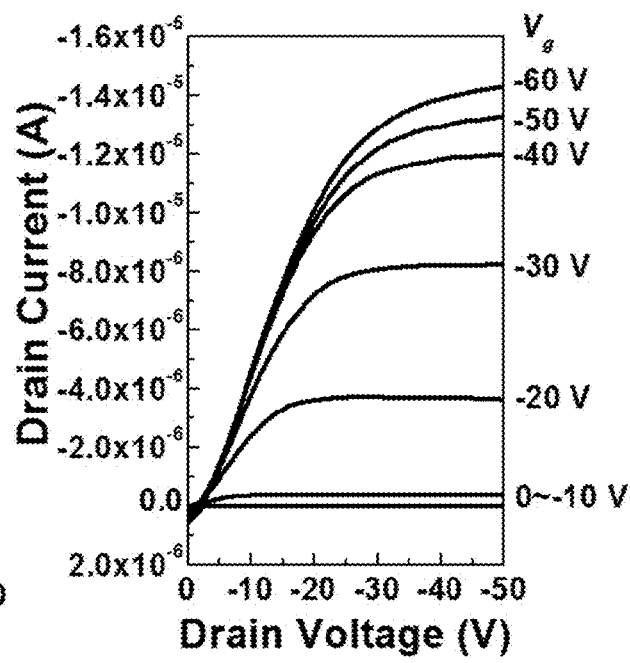
FIG. 6(B) shows electron output characteristic curves.

The test results are detailed below with reference to FIG. 6.

In Embodiment 2, a p-type filed-effect transistor was produced by vacuum-sputtering the pentacene 60 on the silver nanowires 40 (which served as the bottom electrodes, with channel length=40 μm and channel width=1000 μm) and was tested at room temperature in a glove box, using Keithley 4200-SCS Semiconductor Parametric Analyzer. To establish device reproducibility, each transistor produced was tested at least ten times. Electron transport properties were tested through a threshold voltage test by varying the input voltage from 10V to −60V at an interval of 1V, and the electron transport characteristic curve obtained is plotted in FIG. 6(A). Output properties were tested through a threshold voltage test by varying the input voltage from 0V to 60V at an interval of 1V, and the output characteristic curves obtained are plotted in FIG. 6(B). According to the calculation results of the transistors under test, the average electron transport rate is 0.12, the highest electron transport rate is 0.21, and the average on/off ratio is as high as $1.2\times10^7$. Thus, the test results demonstrate the stability and feasibility of the patterned silver nanowire electrodes of the present invention.

What is claimed is:

1. A method for producing patterned metal nanowires, comprising the steps of:
    (a) applying a solution of a photosensitive polyamic acid polymer to a substrate, and drying the solution by baking;
    (b) attaching a photomask to the photosensitive polyamic acid polymer, and irradiating the photosensitive polyamic acid polymer with energy rays;
    (c) developing the photosensitive polyamic acid polymer with a developer solution to obtain a patterned polyamic acid film;
    (d) coating the polyamic acid film and the substrate with a suspension of metal nanowires; and
    (e) removing metal nanowires of the suspension outside the patterned polyamic acid film.

2. The method of claim 1, wherein the solution of the photosensitive polyamic acid polymer is applied at a thickness of 450-2000 nm.

3. The method of claim 1, wherein the substrate is a silicon dioxide wafer.

4. The method of claim 1, wherein the solution of the photosensitive polyamic acid polymer is obtained by first preparing a polyamic acid polymer solution from 1,4-cyclohexyldiamine (CHDA) monomers and 3,3',4,4'-biphenyltetracarboxylic acid dianhydride (BPDA) and then adding a cinnamic-type photobase generator (PBG) into the polyamic acid polymer solution.

5. The method of claim 1, wherein the solution of the photosensitive polyamic acid polymer has a viscosity of 0.3~0.4 dL/g.

6. The method of claim 1, wherein in the step (d), the patterned polyamic acid film is coated with the suspension of metal nanowires by spray coating.

7. The method of claim 1, wherein the suspension of metal nanowires is prepared from an ethanol solution and contains said metal nanowires at a concentration of 1 mg/ml.

8. The method of claim 1, wherein in the step (e), the metal nanowires outside the patterned polyamic acid film are removed by peeling with an adhesive tape.

* * * * *